United States Patent
Elmala

(10) Patent No.: US 7,629,844 B2
(45) Date of Patent: Dec. 8, 2009

(54) DEVICE, SYSTEM, AND METHOD OF SEMI-DOHERTY OUTPHASING AMPLIFICATION

(75) Inventor: Mostafa Elmala, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 67 days.

(21) Appl. No.: 11/968,170

(22) Filed: Jan. 1, 2008

(65) Prior Publication Data

US 2009/0167434 A1 Jul. 2, 2009

(51) Int. Cl.
*H03F 3/68* (2006.01)
(52) U.S. Cl. .................................. 330/124 R
(58) Field of Classification Search ............. 330/124 R, 330/295
See application file for complete search history.

(56) References Cited

U.S. PATENT DOCUMENTS

| | | | | | |
|---|---|---|---|---|---|
| 4,335,363 | A | * | 6/1982 | Bowers | 332/180 |
| 6,311,046 | B1 | * | 10/2001 | Dent | 455/91 |
| 6,472,934 | B1 | * | 10/2002 | Pehlke | 330/10 |
| 7,262,656 | B2 | * | 8/2007 | Shiikuma | 330/124 R |

* cited by examiner

*Primary Examiner*—Steven J Mottola
(74) *Attorney, Agent, or Firm*—Shiloh et al.

(57) ABSTRACT

Device, system, and method of semi-Doherty outphasing amplification. For example, an apparatus includes: a first circuit path comprising a first switching amplifier connected in parallel through a first quarter-wave transmission line to a second switching amplifier; and a second circuit path comprising a third switching amplifier connected in parallel through a second quarter-wave transmission line to a fourth switching amplifier, wherein the first circuit path is connected to a circuit node through a third quarter-wave transmission line, and wherein the second circuit path is connected to said circuit node through a fourth quarter-wave transmission line.

13 Claims, 3 Drawing Sheets

DEVICE, SYSTEM, AND METHOD OF SEMI-DOHERTY OUTPHASING AMPLIFICATION

BACKGROUND

Some wireless communication devices may include a transmitter having a Power Amplifier (PA). Some transmitters utilize an outphasing architecture, based on decomposing an input signal into two constant amplitude signals driving two high-efficiency switching amplifiers. For example, two quarter-wave transmission lines are used for power combining, together with two non-isolated switching amplifiers and a common load. Two constant amplitude signals are extracted, and are used to drive the two switching amplifiers. The load seen by each amplifier depends on the relative phase of the input signals. When the output power is low, the load on each amplifier is high. Accordingly, an outphasing PA may be more efficient than a non-outphasing PA, particularly at a low output power region.

In contrast, some wireless communication devices may include a transmitter having a Doherty PA, for example, a high-efficiency linear PA utilizing two separate amplifiers. The Doherty PA includes two amplifiers, namely, a peak amplifier and a carrier amplifier, working in different classes (for example, class B and class C) to achieve linear behavior. A quadrature hybrid coupler provides input signals to the two amplifiers, while an impedance transformer combines the power generated by the two amplifiers. The impedance transformer, for example, a quarter-wave transmission-line, contributes a phase shift of 90 degrees. Accordingly, a quadrature hybrid is utilized such that the output currents are added in-phase. When the peak amplifier begins to conduct (for example, within the upper 6 dB of power range), the impedance seen by the carrier amplifier starts to decrease, and the PA maintains high efficiency.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
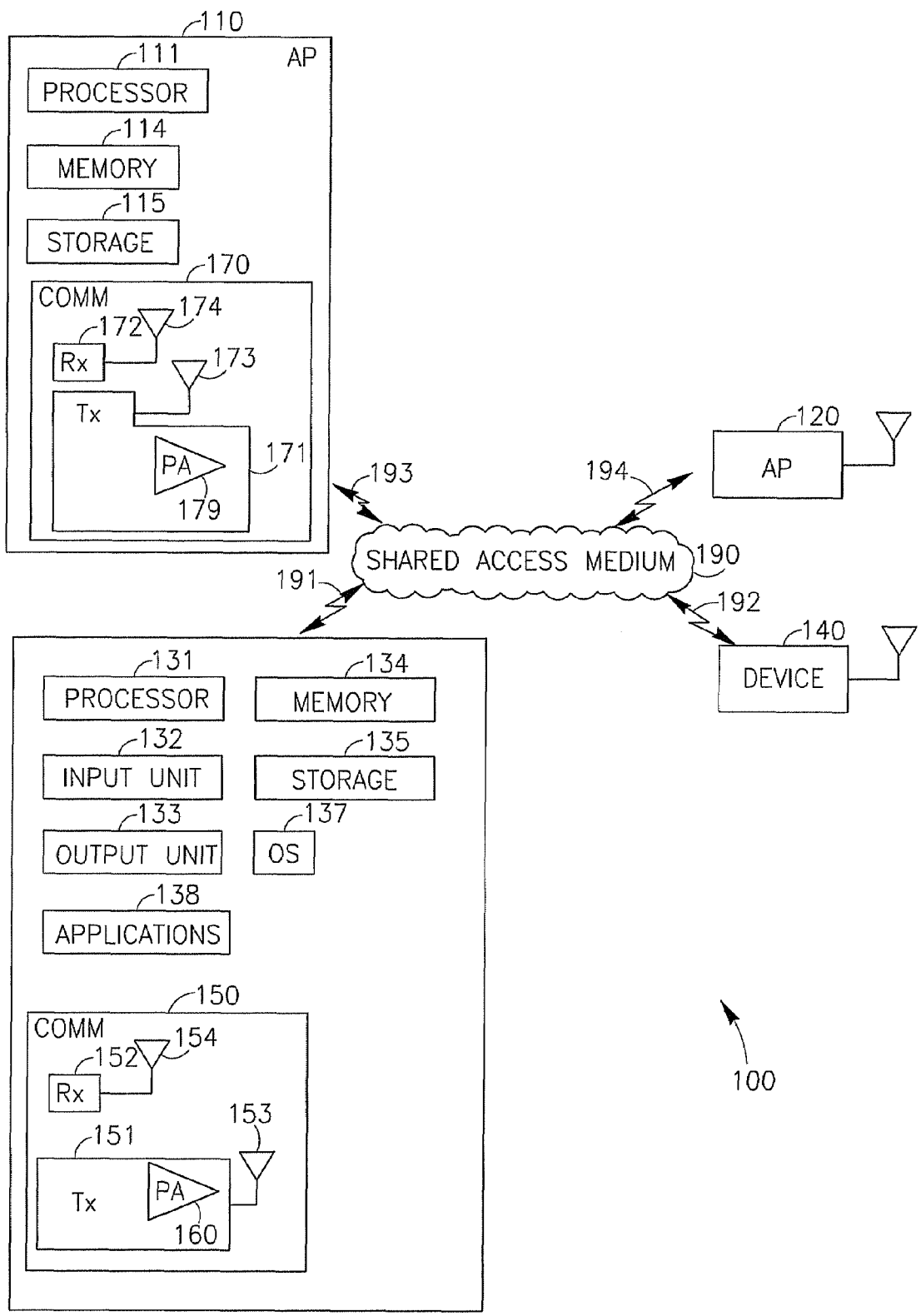
FIG. 1 is a schematic block diagram illustration of a wireless communication system in accordance with a demonstrative embodiment of the invention.
Figure 2:
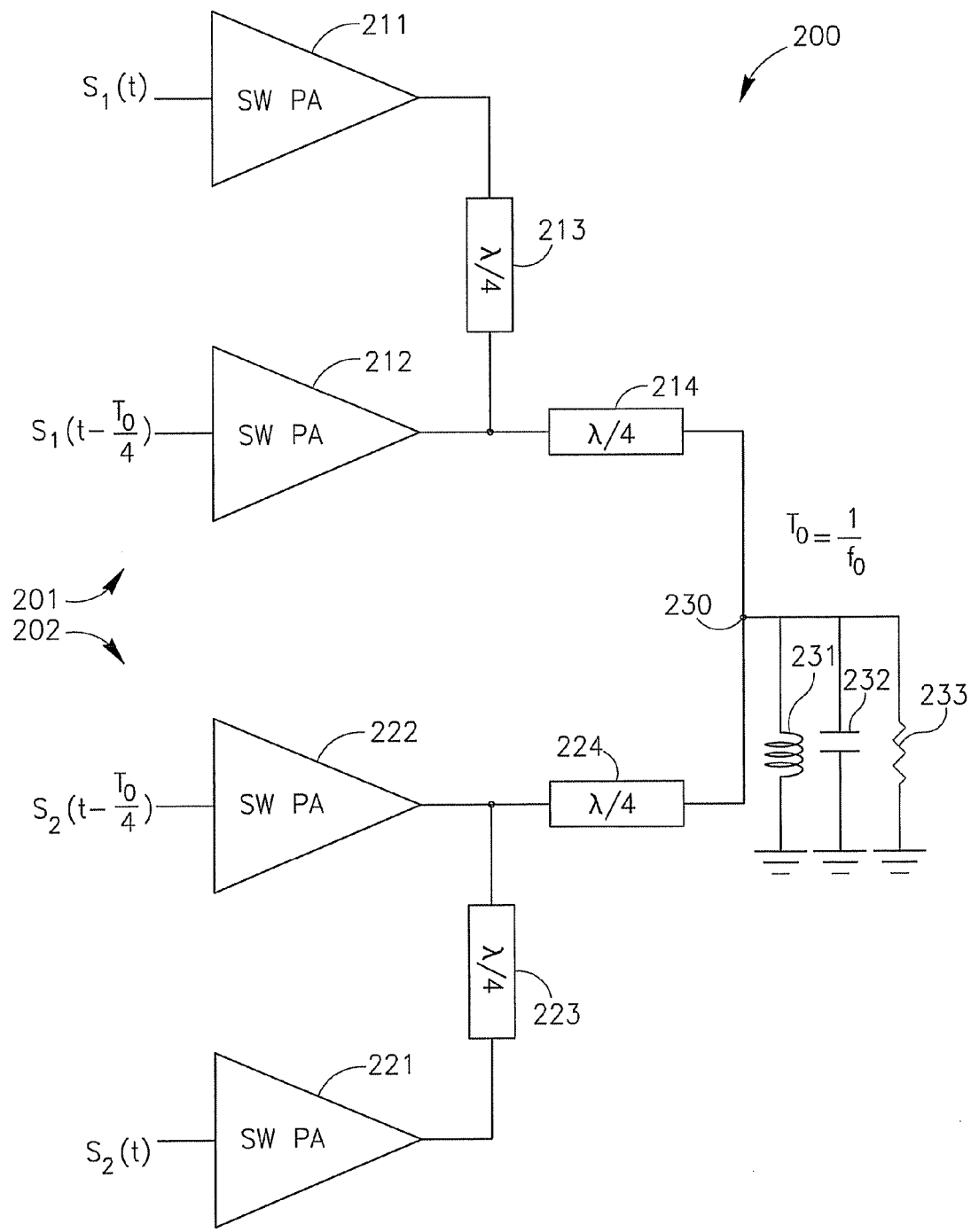
FIG. 2 is a schematic block diagram illustration of a semi-Doherty outphasing circuit in accordance with a demonstrative embodiment of the invention.

In the following detailed description, numerous specific details are set forth in order to provide a thorough understanding of some embodiments of the invention. However, it will be understood by persons of ordinary skill in the art that embodiments of the invention may be practiced without these specific details. In other instances, well-known methods, procedures, components, units and/or circuits have not been described in detail so as not to obscure the discussion.

Discussions herein utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality" as used herein includes, for example, "multiple" or "two or more". For example, "a plurality of items" includes two or more items.

Although portions of the discussion herein relate, for demonstrative purposes, to wired links and/or wired communications, embodiments of the invention are not limited in this regard, and may include one or more wired or wireless links, may utilize one or more components of wireless communication, may utilize one or more methods or protocols of wireless communication, or the like. Some embodiments of the invention may utilize wired communication and/or wireless communication.

Some embodiments of the invention may be used in conjunction with various devices and systems, for example, a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a non-mobile or non-portable device, a wireless communication station, a wireless communication device, a wireless Access Point (AP), a wired or wireless router, a wired or wireless modem, a wired or wireless network, a Local Area Network (LAN), a Wireless LAN (WLAN), a Metropolitan Area Network (MAN), a Wireless MAN (WMAN), a Wide Area Network (WAN), a Wireless WAN (WWAN), a Personal Area Network (PAN), a Wireless PAN (WPAN), devices and/or networks operating in accordance with existing IEEE 802.11, 802.11a, 802.11b, 802.11g, 802.11n, 802.16, 802.16d, 802.16e, 802.20, 802.21 standards and/or future versions and/or derivatives of the above standards, units and/or devices which are part of the above networks, one way and/or two-way radio communication systems, cellular radio-telephone communication systems, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device (e.g., BlackBerry, Palm Treo), a Wireless Application Protocol (WAP) device, or the like.

Some embodiments of the invention may be used in conjunction with one or more types of wireless communication signals and/or systems, for example, Radio Frequency (RF), Infra Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, Enhanced Data rates for GSM Evolution (EDGE), or the like. Embodiments of the invention may be used in various other devices, systems and/or networks.

FIG. 1 schematically illustrates a block diagram of a wireless communication system 100 in accordance with some demonstrative embodiments of the invention. System 100 may include one or more wireless communication devices, for example, wireless communication devices 130 and 140, as well as one or more wireless Access Points (APs), for example, APs 110 and 120. The components of system 100 may communicate using a shared access medium 190, for example, using wireless links 191-194.

Device 130 and/or device 140 may be or may include, for example, a mobile phone, a cellular phone, a handheld device, a computing device, a computer, a Personal Computer (PC), a server computer, a client/server system, a mobile computer, a portable device or computer, a laptop computer, a notebook computer, a tablet computer, a network of multiple interconnected devices, or the like.

Device 130 may include, for example, a processor 131, an input unit 132, an output unit 133, a memory unit 134, a storage unit 135, and a communication unit 150. Device 130 may optionally include other suitable hardware components and/or software components.

Processor 131 includes, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 131 executes instructions, for example, of an Operating System (OS) 137 of device 130 or of one or more applications 138.

Input unit 132 includes, for example, a keyboard, a keypad, a mouse, a touch-pad, a track-ball, a stylus, a microphone, or other suitable pointing device or input device. Output unit 133 includes, for example, a monitor, a screen, a Cathode Ray Tube (CRT) display unit, a Liquid Crystal Display (LCD) display unit, a plasma display unit, one or more audio speakers or earphones, or other suitable output devices.

Memory unit 134 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 135 includes, for example, a hard disk drive, a floppy disk drive, a Compact Disk (CD) drive, a CD-ROM drive, a Digital Versatile Disk (DVD) drive, or other suitable removable or non-removable storage units. Memory unit 134 and/or storage unit 135, for example, store data processed by device 130.

Communication unit 150 includes, for example, a wireless transceiver, a wireless modem, a wireless Network Interface Card (NIC), an IEEE 802.11 transceiver, an IEEE 802.16 transceiver, or the like. For example, communication unit 150 includes a transmitter 151 and a receiver 152.

Transmitter 151 includes, for example, a wireless Radio Frequency (RF) transmitter able to transmit wireless RF signals, blocks, frames, transmission streams, packets, messages and/or data, e.g., through an antenna 153. Transmitter 151 includes a Power Amplifier (PA) 160.

Receiver 152 includes, for example, a wireless Radio Frequency (RF) receiver able to receive wireless RF signals, blocks, frames, transmission streams, packets, messages and/or data, e.g., through an antenna 154.

Optionally, transmitter 151 and receiver 152 may be implemented using a transceiver, a transmitter-receiver, or other suitable component. Optionally, antenna 153 and antenna 154 may be implemented using a common antenna, a common set of multiple antennas, or other suitable component(s). For example, antenna 153 and/or antenna 154 may include an internal and/or external RF antenna, a dipole antenna, a monopole antenna, an omni-directional antenna, an end fed antenna, a circularly polarized antenna, a micro-strip antenna, a diversity antenna, or other type of antenna suitable for transmitting and/or receiving wireless communication signals, blocks, frames, transmission streams, packets, messages and/or data.

In some embodiments, some or all of the components of device 130 may be enclosed in a common housing or packaging, and may be interconnected or operably associated using one or more wired or wireless links. In other embodiments, components of device 130 may be distributed among multiple or separate devices or locations.

AP 110 and/or AP 120 may be or may include, for example, a wireless AP, a wireless Base Station (BS), a wireless controller, a wireless router, a component of an ad-hoc network operating as an AP or a router, an AP of a Basic Service Set (BSS), a device operating as AP in an Independent BSS (IBSS), an AP or a device able to connect among multiple wireless communication devices, a device able to form a wireless communication network, a device able to relay among wireless communication devices, or the like.

AP 110 may include, for example, a processor 111, a memory unit 114, a storage unit 115, and a communication unit 170. The communication unit 170 may include, for example, a transmitter 171 associated with an antenna 173, and a receiver 172 associated with an antenna 174. The transmitter 171 may include a PA 179.

Device 140 may include components similar, in properties and/or in functionality, to the components of device 130. AP 120 may include components similar, in properties and/or in functionality, to the components of AP 110.

In some embodiments, system 100 may include one or more wireless communication networks, for example, an a-synchronic wireless network, an asynchronous wireless network, a synchronic wireless network, a synchronous wireless network, a burstable wireless network, a non-burstable wireless network, a hybrid wireless network, a combination of one or more wireless networks, or the like.

In some embodiments, the transmitter 151 of device 130, the PA 160 of device 130, the transmitter 171 of AP 110, and/or the PA 179 of AP 110 may include high-efficiency switching semi-Doherty outphasing architecture, as described herein.

Figure schematically illustrates a block diagram of a semi-Doherty outphasing circuit 200 in accordance with some demonstrative embodiments of the invention. Circuit 200 may be used, for example, in the transmitter 151 of device 130 of FIG. 1, in the PA 160 of device 130 of FIG. 1, in the transmitter 171 of AP 110 of FIG. 1, and/or in the PA 179 of AP 110 of FIG. 1.

Circuit 200 includes two parallel paths 201 and 202. Path 201 includes two switching PAs 211 and 212 connected in parallel through a quarter-wave transmission line 213 (which provides a semi-Doherty effect). Similarly, path 202 includes two switching PAs 221 and 222 connected in parallel through a quarter-wave transmission line 223 (which provides a semi-Doherty effect). Path 201 is connected to a node 230 through a quarter-wave transmission line 214 (which provides an outphasing effect); similarly, path 202 is connected to node 230 through a quarter-wave transmission line 224 (which provides an outphasing effect). Node 230 is further connected to a parallel RLC sub-circuit, which includes: a first branch having a resistor 233 connected to a ground or sink; a second, parallel, branch having a capacitor 232 connected to a ground or sink; and a third, parallel, branch having an inductor 231 connected to a ground or sink.

PA 211 receives a first signal, denoted S1; and PA 212 receives the first signal delayed by a quarter of a period of the carrier frequency. Similarly, PA 221 receives a second signal, denoted S2; and PA 222 receives the second signal delayed by a quarter of a period of the carrier frequency. The RLC sub-circuit resonates at a frequency equal to one over the period of the carrier frequency.

Circuit 200 thus includes outphasing architecture in which each switching amplifier is replaced by a semi-Doherty block. In a first semi-Doherty block, the two switching amplifiers 211-212 operate together to achieve the Doherty effect of enhancing the efficiency by combining the power through an impedance transformer (the quarter-wave transmission line 213). Similarly, in the second semi-Doherty block, the two switching amplifiers 221-222 operate together to achieve the Doherty effect of enhancing the efficiency by combining the power through an impedance transformer (the quarter-wave transmission line 223).

This architecture results in the loading effect required to enhance the efficiency of each branch separately. The power from the two semi-Doherty blocks is then added using outphasing architecture, namely, using the two quarter-wave transmission lines 214 and 224.

In some embodiments, the 90-degrees phase shift required for each semi-Doherty block may be generated using a DSP implementation, and therefore a quadrature hybrid may not be required, thereby saving die area. Circuit 200 results is better efficiency characteristics than a Doherty architecture circuit or an outphasing architecture circuit; and a higher power may be achieved, for example, due to the combining of power from four amplifiers.

Circuit 200 may thus allow a transmitter to achieve high output power combined with high-efficiency, and further allows power saving of the wireless communication device. The Doherty effect is combined into outphasing architecture to provide improved efficiency characteristics while increasing the maximum output power (for example, to meet IEEE 802.16 requirements). By emulating the effect of Doherty amplifiers in an outphasing architecture, the benefits of Doherty architecture and outphasing architecture are combined, and the efficiency of the transmitter is improved.

In some embodiments, the semi-Doherty outphasing transmitter may not include reactive components (e.g., Chireix technique) to boost the efficiency with power back-off. In some embodiments, adding such reactive components may degrade the linearity of the transmitter. In some embodiments, a pre-distortion algorithm may be used, for example, similar to pre-distortion algorithms of outphasing architectures.

Some embodiments allow achieving higher efficiency with power back-off from maximum saturated power. In OFDM or other signaling techniques having large peak-to-average ratio, the semi-Doherty outphasing transmitter may save power or may reduce power consumption, while not degrading linearity. In some embodiments, the net linearity characteristic may be comparable to or better than a traditional outphasing transmitter.

In some embodiments, this semi-Doherty outphasing architecture does not require utilization of hybrid couplers for the semi-Doherty PA blocks, for example, since the driving signals may be generated digitally. This may allow saving of significant die area of the transmitter. Furthermore, the quarter-wave transmission lines may be integrated on-die, for example, using pi-network approximation (e.g., in 90 nanometer CMOS PA), thereby saving additional die area of the transmitter.

In some embodiments, the semi-Doherty amplifiers are switching-based amplifiers (e.g., in contrast with traditional Doherty amplifiers). The switching amplifiers are used to emulate the Doherty effect in outphasing architecture. This allows the transmitter architecture to be "digital-style" or "digital friendly", thereby providing scalability with process, reconfiguration for multi-mode operation, die integration, small die area, power saving, digital control, reduced sensitivity to process and temperature, or the like.

In some embodiments, the semi-Doherty outphasing architecture may facilitate the integration of small CMOS PA modules into a RF Integrated Circuit (RFIC). Accordingly, requirements of achieving maximum power levels in the order of 30 dBm (for example, in IEEE 802.16 systems) may be achieved using CMOS technology and processes. For example, to achieve saturated power (Psat) of 30 dBm, the architecture utilizes four switching PA modules, each one of them having a low Psat requirement of 24 dBm; this may be implemented, for example, using 90 nanometer CMOS PA design. Additionally, PA integration in advanced CMOS processes may become more reliable, since each PA module may use a lower supply voltage, thereby avoiding break-down problems and/or hot-carrier effects. In some embodiments, the substantially complete integration of the transmitter in CMOS may reduce costs of manufacturing the transmitter.

Some embodiments may be utilized in conjunction with applications that require a large transmission power as well as low power consumption, e.g., a portable or mobile device, an IEEE 802.16 communication device, millimeter wave (mm-wave) systems, or other wireless communication devices or systems.

Figure 3:
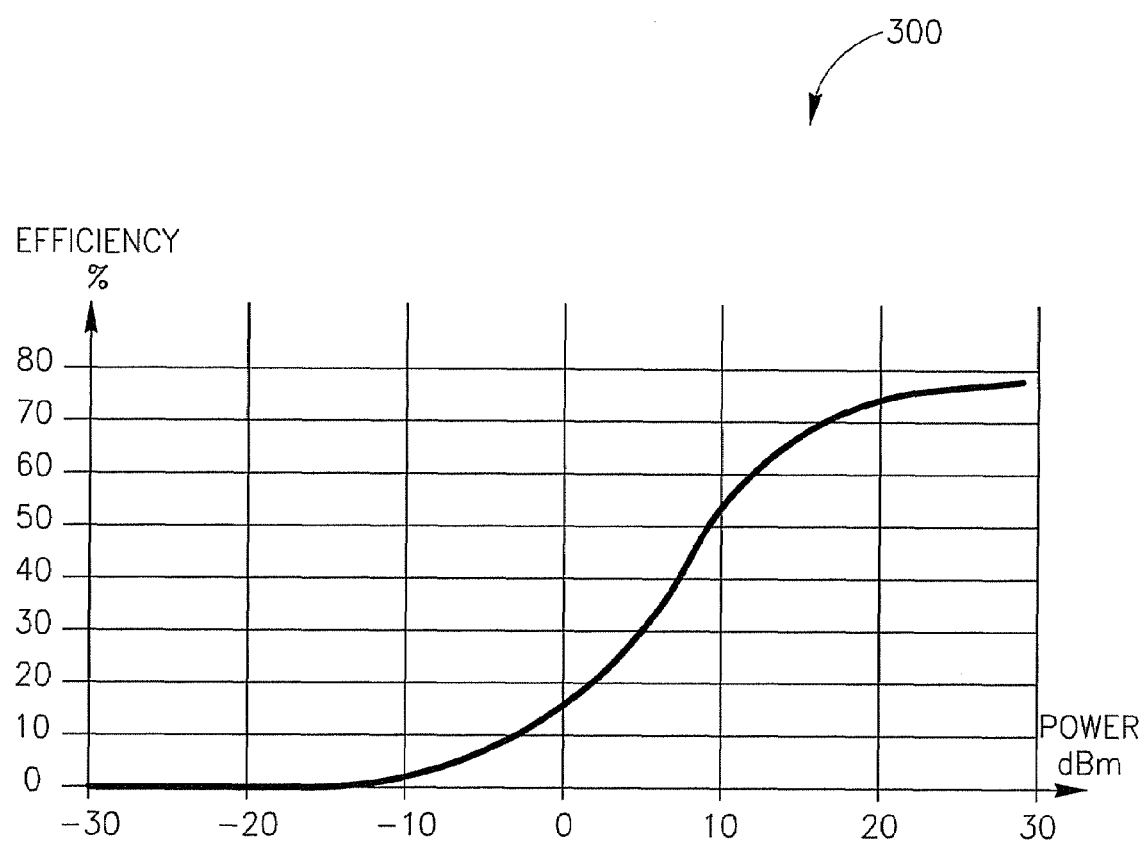
FIG. 3 is a schematic illustration of a chart indicating efficiency characteristics of a semi-Doherty outphasing transmitter in accordance with a demonstrative embodiment of the invention.

FIG. 3 schematically illustrates a chart 300 indicating efficiency characteristics of a semi-Doherty outphasing transmitter in accordance with some embodiments of the invention. The vertical axis indicates the percentage of transmitter efficiency; whereas the horizontal axis indicates the output power, measured in dBm. System-level simulations were performed using Advanced Design System (ADS) by modeling the switching amplifier as a switch and driving class-F PA, thereby comparing simulation results of a traditional outphasing transmitter with simulation results of a semi-Doherty outphasing transmitter.

The efficiency characteristics of the semi-Doherty outphasing transmitter, shown in chart 300, indicate higher efficiency with power back-off than the traditional outphasing transmitter. Additionally, the efficiency characteristic shown in chart 300 is higher than the efficiency characteristic of a traditional Doherty transmitter, which is typically high within the upper 6 dB of power back-off.

The efficiency curve of chart 300 may be utilized in various applications (e.g., in conjunction with IEEE 802.16 communications or IEEE 802.11 communications), particularly in applications in which the average power is significantly lower than the peak power.

Some embodiments of the invention, for example, may take the form of an entirely hardware embodiment, an entirely software embodiment, or an embodiment including both hardware and software elements. Some embodiments may be implemented in software, which includes but is not limited to firmware, resident software, microcode, or the like.

Furthermore, some embodiments of the invention may take the form of a computer program product accessible from a computer-usable or computer-readable medium providing program code for use by or in connection with a computer or any instruction execution system. For example, a computer-usable or computer-readable medium may be or may include any apparatus that can contain, store, communicate, propagate, or transport the program for use by or in connection with the instruction execution system, apparatus, or device.

In some embodiments, the medium may be an electronic, magnetic, optical, electromagnetic, infrared, or semiconductor system (or apparatus or device) or a propagation medium. Some demonstrative examples of a computer-readable medium may include a semiconductor or solid state memory, magnetic tape, a removable computer diskette, a random access memory (RAM), a read-only memory (ROM), a rigid magnetic disk, and/or an optical disk. Some demonstrative examples of optical disks include compact disk-read only memory (CD-ROM), compact disk-read/write (CD-R/W), and DVD.

In some embodiments, a data processing system suitable for storing and/or executing program code may include at least one processor coupled directly or indirectly to memory elements, for example, through a system bus. The memory elements may include, for example, local memory employed during actual execution of the program code, bulk storage, and cache memories which may provide temporary storage of at least some program code in order to reduce the number of times code must be retrieved from bulk storage during execution.

In some embodiments, input/output or I/O devices (including but not limited to keyboards, displays, pointing devices, etc.) may be coupled to the system either directly or through intervening I/O controllers. In some embodiments, network adapters may be coupled to the system to enable the data processing system to become coupled to other data processing systems or remote printers or storage devices, for example, through intervening private or public networks. In some embodiments, modems, cable modems and Ethernet cards are demonstrative examples of types of network adapters. Other suitable components may be used.

Functions, operations, components and/or features described herein with reference to one or more embodiments, may be combined with, or may be utilized in combination with, one or more other functions, operations, components and/or features described herein with reference to one or more other embodiments, or vice versa.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. An apparatus comprising:
a first circuit path comprising a first switching amplifier connected in parallel through a first quarter-wave transmission line to a second switching amplifier; and
a second circuit path comprising a third switching amplifier connected in parallel through a second quarter-wave transmission line to a fourth switching amplifier,
wherein the first and second circuit paths are connected, in parallel, to a common circuit node through third and fourth respective quarter-wave transmission lines.

2. The apparatus of claim 1, wherein said circuit node is connected to a sub-circuit comprising:
a first branch including a resistor connected to a first sink;
a second, parallel, branch including a capacitor connected to a second sink; and
a third, parallel, branch including an inductor connected to a third sink.

3. The apparatus of claim 2, wherein the first switching amplifier is to receive a first signal, and the second switching amplifier is to receive the first signal delayed by a quarter of a period of a carrier frequency.

4. The apparatus of claim 3, wherein the third switching amplifier is to receive a second signal, and the fourth switching amplifier is to receive the second signal delayed by a quarter of said period of a carrier frequency.

5. The apparatus of claim 4, wherein the oscillation period comprises an oscillation period of the sub-circuit including the resistor, the capacitor, and the inductor.

6. The apparatus of claim 5, wherein the apparatus comprises a semi-Doherty outphasing power amplifier.

7. The apparatus of claim 5, wherein the apparatus comprises a semi-Doherty outphasing transmitter.

8. The apparatus of claim 5, wherein the apparatus comprises a device selected from the group consisting of:
a wireless transceiver, a wireless communication device, a wireless communication station,
a wireless Access Point, and a wireless Base Station.

9. A system comprising:
a semi-Doherty outphasing transmitter comprising:
a first semi-Doherty block to generate semi-Doherty effect; and
a second semi-Doherty block to generate semi-Doherty effect,
wherein the first and second blocks are connected in parallel to a common circuit node through first and second 90-degrees phase shifters,
wherein the first semi-Doherty block comprises a first set of two parallel switching amplifiers connected through a third 90-degrees phase shifter,
and wherein the second semi-Doherty block comprises a second set of two parallel switching amplifiers connected through a fourth 90-degrees phase shifter.

10. The system of claim 9, comprising:
a parallel RLC sub-circuit connected to said common circuit node, the parallel RLC sub-circuit comprising:
a first branch including a resistor connected to a first ground;
a second, parallel, branch including a capacitor connected to a second ground; and
a third, parallel, branch including an inductor connected to a third ground.

11. The system of claim 10, wherein the first set of two parallel switching amplifiers is to receive a first signal and the first signal delayed by a quarter of a period of a carrier frequency.

12. The system of claim 11, wherein the second set of two parallel switching amplifiers is to receive a second signal and the second signal delayed by a quarter of the period of the carrier frequency.

13. The system of claim 12, wherein the oscillation period comprises an oscillation period of the parallel RLC sub-circuit.

* * * * *